United States Patent [19]

Ohba

[11] Patent Number: 5,228,044
[45] Date of Patent: Jul. 13, 1993

[54] ULTRAVIOLET SEMICONDUCTOR LASER AND METHOD OF MANUFACTURING THE SAME

[75] Inventor: Yasuo Ohba, Yokohama, Japan

[73] Assignee: Kabushiki Kaisha Toshiba, Kawasaki, Japan

[21] Appl. No.: 735,279

[22] Filed: Jul. 24, 1991

[30] Foreign Application Priority Data

Jul. 27, 1990 [JP] Japan .................. 2-200428

[51] Int. Cl.⁵ ................................ H01S 3/19
[52] U.S. Cl. .................................. 372/45
[58] Field of Search ................... 372/45, 44, 43

[56] References Cited

U.S. PATENT DOCUMENTS 4,980,730 12/1990 Mishima et al. ............... 357/17

FOREIGN PATENT DOCUMENTS 0379359 7/1990 European Pat. Off. .

OTHER PUBLICATIONS

J. L. Shay & J. H. Wernick, CH2, "The Chalcopyrite Structure and Crystal Growth", *Ternary Chalcopyrite Semiconductors: Growth, Electronic Properties, and Applications*, pp. 1–15, Jan. 1975.

Japanese Journal of Applied Physics, vol. 29, No. 2, pp. 205–206, Feb. 1990, H. Amano, et al., "Stimulated Emission Near Ultraviolet at Room Temperature From a GaN Film Grown On Shapphire By MOVPE Using an AIN Buffer Layer".

Soviet Journal of Quantum Electronics, vol. 14, No. 3, pp. 420–422, Mar. 1984, V. I. Kozlovskii, et al., "Ultraviolet ZnS Semiconductor Laser Pumped Longitudinally by an Electron Beam".

Patent Abstracts of Japan, vol. 13, No. 463 (E-833), Oct. 19, 1989, & JP-A-1-179-471, Jul. 17, 1989, O. Mishima, et al., "P-N Junction Type Light Emitting Element of Cubic Boron Nitride" & U.S. Pat. No. 4,980,730.

JEE Journal of Electronic Engineering, vol. 25, No. 258, pp. 82–83, Jun. 1988, "Inorganic Material Research Institute Succeeds in Ultraviolet Ray Emission with c-BN Junction Diode".

Applied Physics Letters, vol. 53, No. 11, pp. 962–964, Sep. 12, 1988, O. Mishima, et al., "Ultraviolet Light-Emitting Diode of a Cubic Boron Nitride PN Junction Made at High Pressure".

*Primary Examiner*—Frank Gonzalez
*Assistant Examiner*—Robert E. Wise
*Attorney, Agent, or Firm*—Oblon, Spivak, McClelland, Maier & Neustadt

[57] ABSTRACT

A BN layer having a zinc blend type crystal structure and a $BeCN_2$ layer having a chalcopyrite type crystal structure are stacked on a substrate via a BP buffer layer, thereby constituting a heterojunction. This heterojunction is used to form an ultraviolet semiconductor laser and other new semiconductor devices such as an LED.

16 Claims, 9 Drawing Sheets

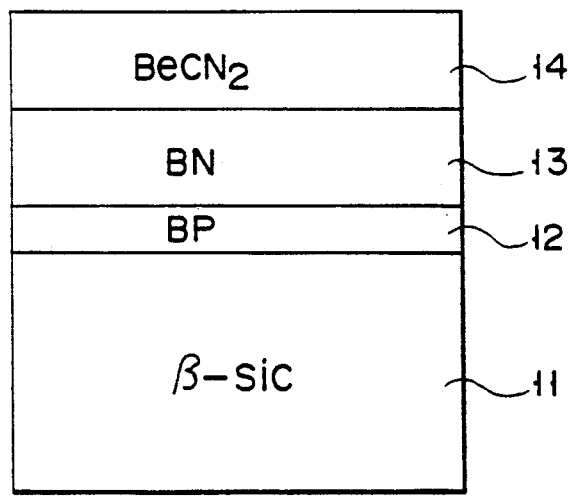
F I G. 1
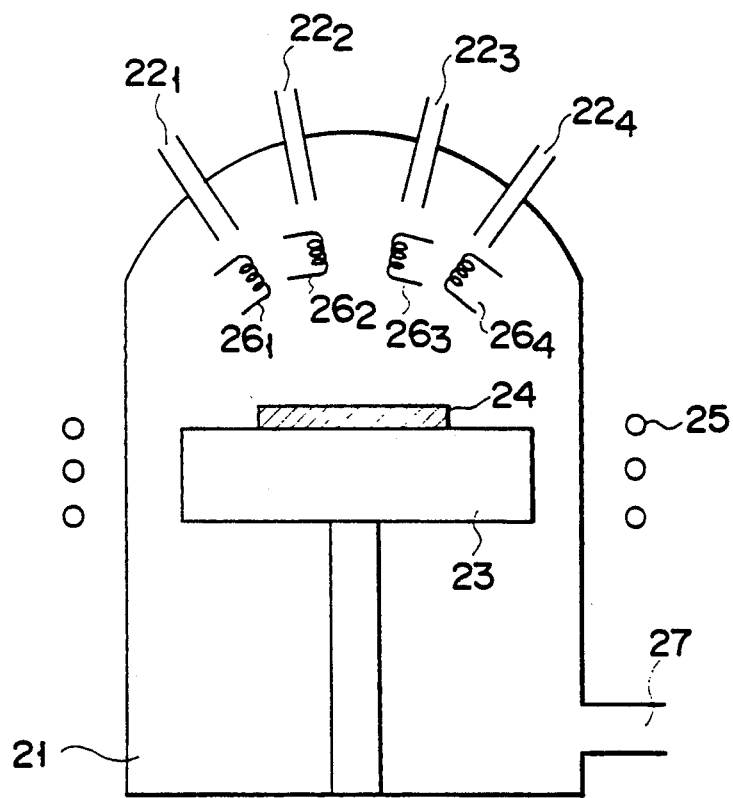
F I G. 2

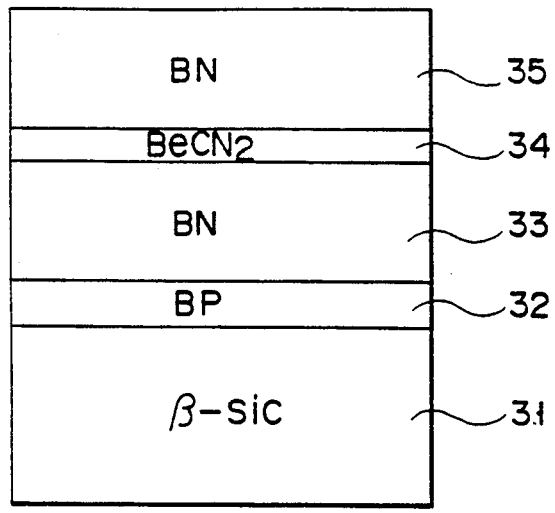
F I G. 3
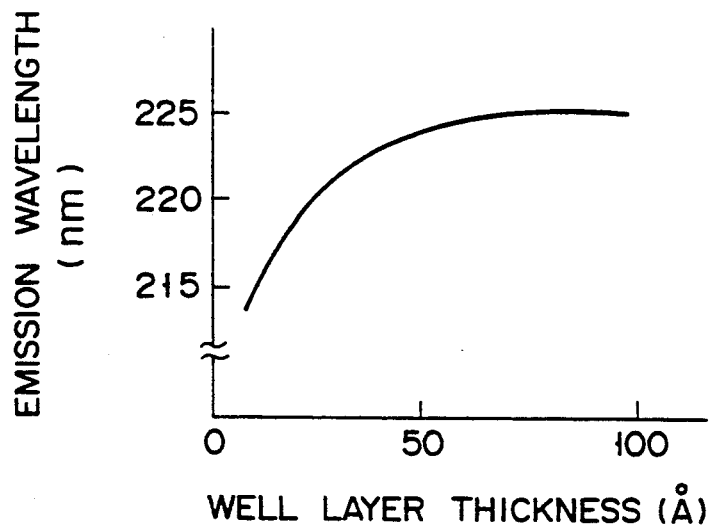
F I G. 4
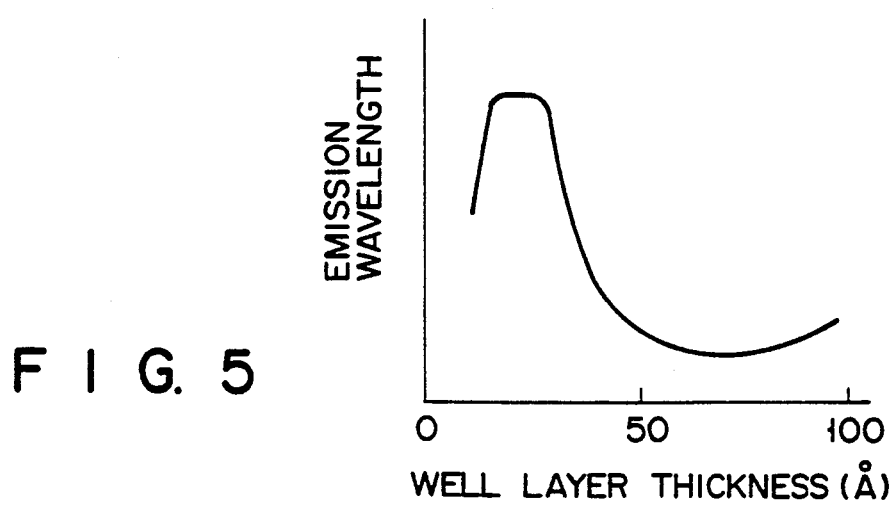
F I G. 5

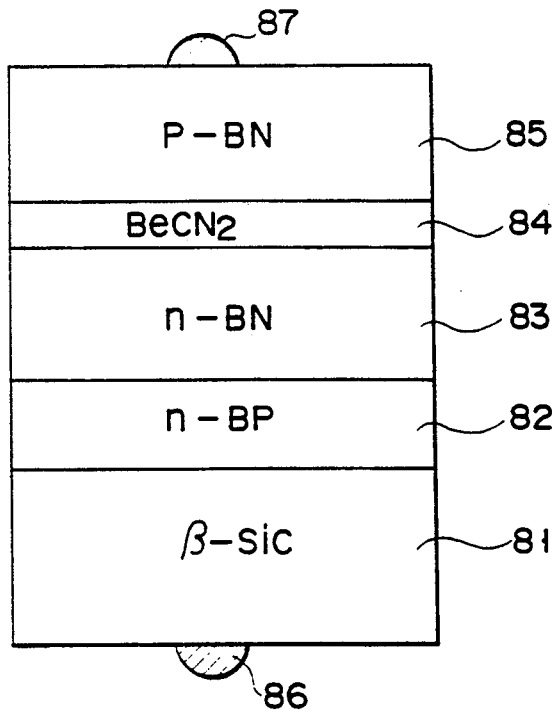
F I G. 8
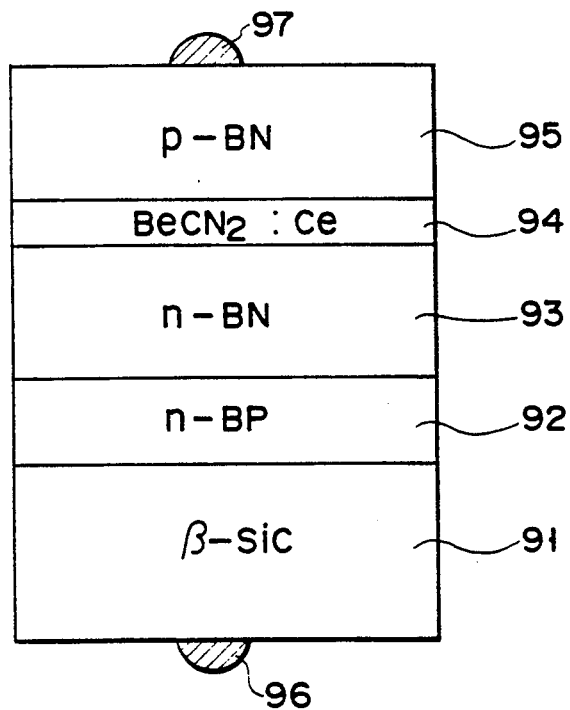
F I G. 9

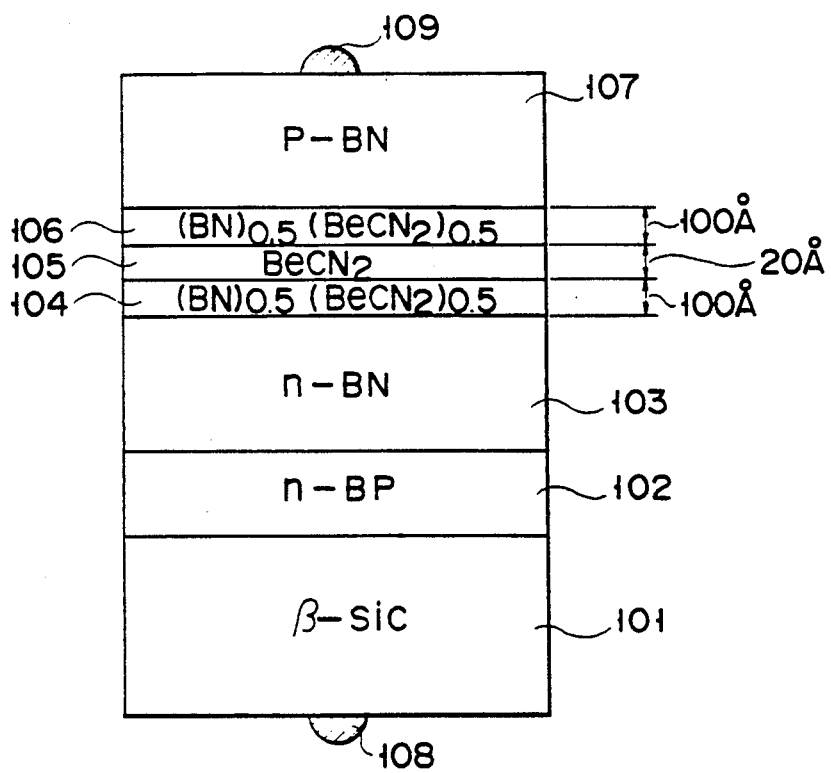
F I G. 10
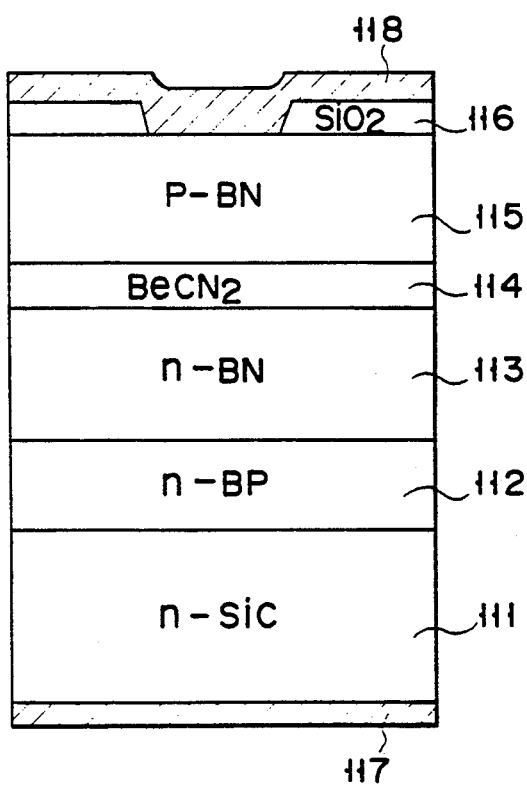
F I G. 11

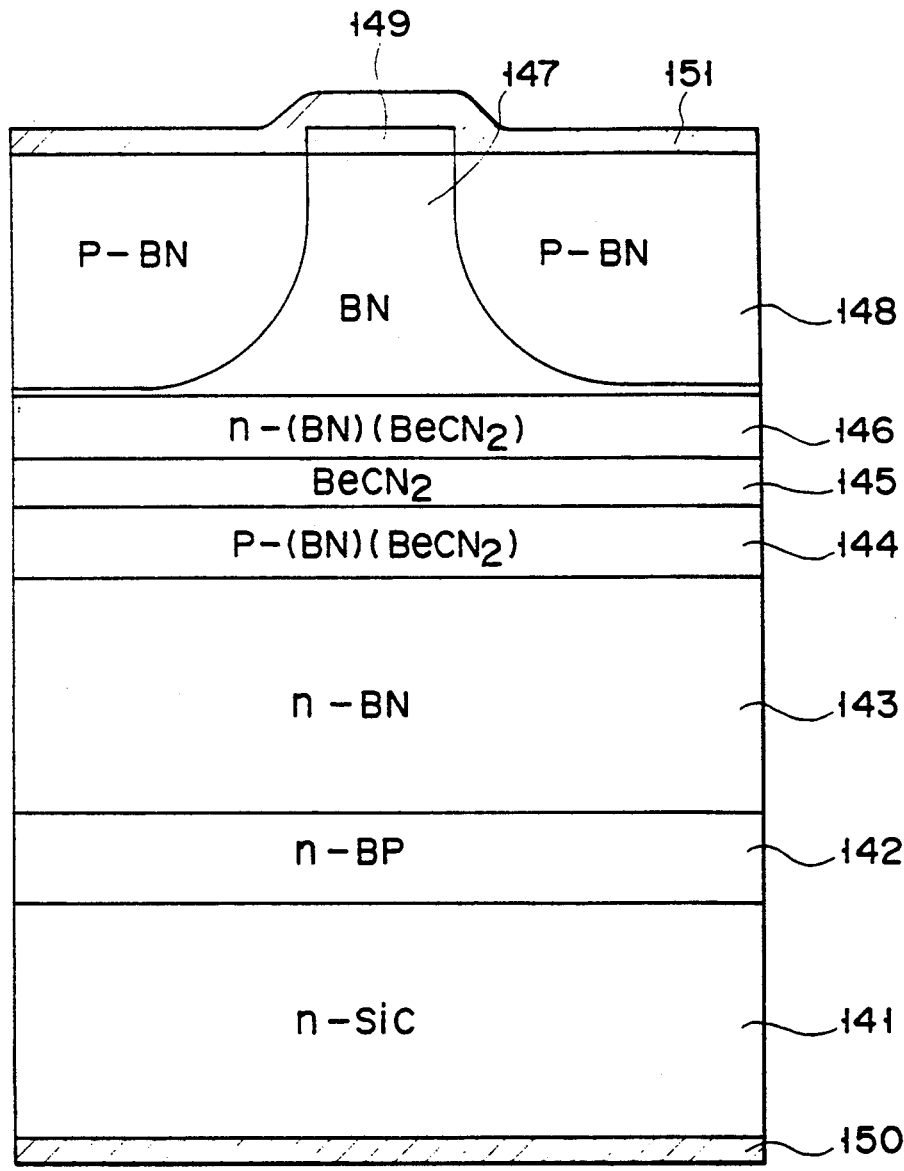
F I G. 14

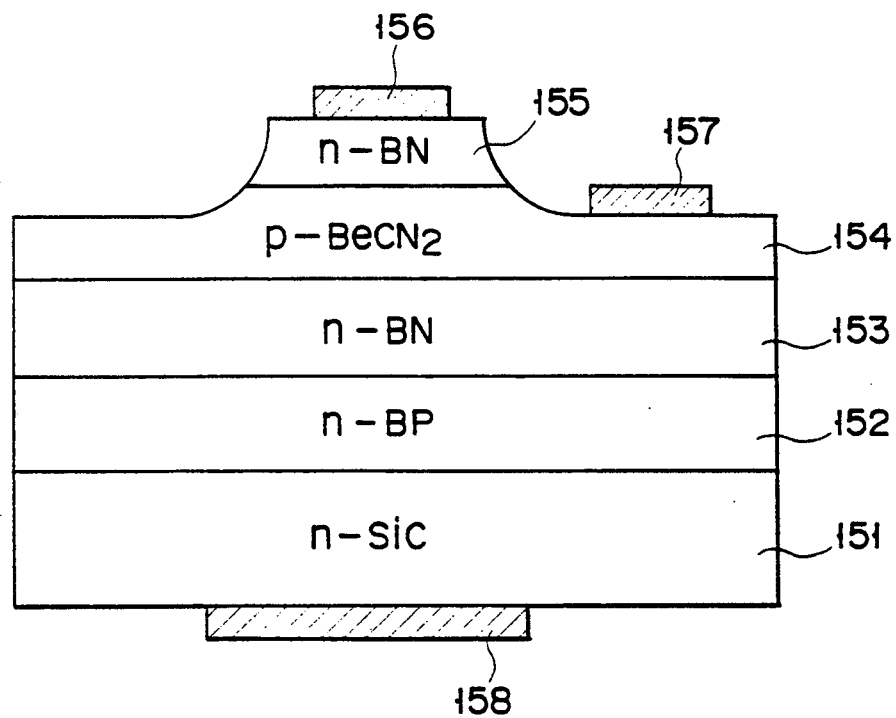
F I G. 15

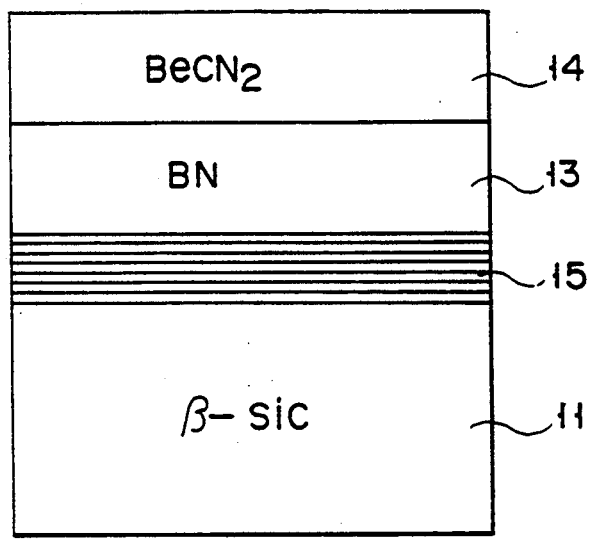
F I G. 16
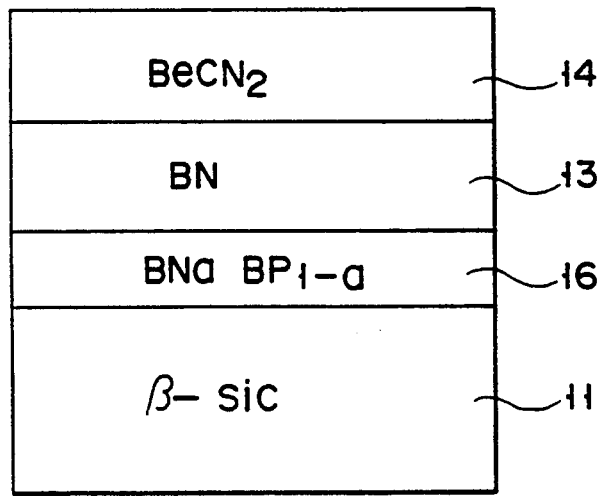
F I G. 17

ULTRAVIOLET SEMICONDUCTOR LASER AND METHOD OF MANUFACTURING THE SAME

BACKGROUND OF THE INVENTION

1. Field of the Invention

The present invention relates to a semiconductor device using a novel compound semiconductor material and, more particularly, to a semiconductor laser capable of light emission up to the ultraviolet region and a method of manufacturing the same.

Description of the Related Art

In order to construct a high-speed and high-density information processing system, realization of a shortwave semiconductor laser has been desired. To realize the shortwave semiconductor laser, a semiconductor material is required to have properties of the following three items.

1) The material must be a direct transition type.
2) The material must allow formation of a p-n junction.
3) The material must allow formation of a heterojunction.

A conventionally known example of a semiconductor material which satisfies all of the above three conditions is InGaAlP. When this InGaAlP-based material is used, it is possible to obtain laser oscillation of up to 580 nm.

To obtain a semiconductor laser having a shorter wavelength, a direct transition type Group II-VI nitride having a band gap of 3 eV or more, for example, has been examined as a promising material. However, since conductivity control has not been achieved yet by using the Group II-VI nitride, no successful use of this nitride has been reported. In particular, almost no examination has been made on a semiconductor laser material, which oscillates in the ultraviolet region having a shorter wavelength than 300 nm and therefore can be used in a wide variety of applications such as an excitation light source for various phosphors and a light source for a photochemical reaction, regardless of a strong demand for it.

The emission energy of an ultraviolet semiconductor laser is 5 eV or more which is close to the chemical bond energy of a laser material. In this respect, the ultraviolet semiconductor laser is required to have characteristics different from those of conventional laser materials from near-infrared to visible regions. That is, the crystal structure of the ultraviolet semiconductor laser must not be damaged by a photon energy upon light emission. For this purpose, a crystal is desired to have a strong lattice with small ionicity as well as a wide band gap. Importance of this condition is apparent also from an often observed phenomenon in that an alkali halide which is an ionic crystal having a wide band gap causes a defect called a color center and is colored upon by a radiation of ultraviolet light.

Examples of a semiconductor material having a band gap of 5 eV or more and capable of allowing conductivity control are limited to only a few materials such as a GaAlN-based material, cubic c-BN, and diamond. Of these materials, although c-BN and diamond have band gaps of 6 eV or more, it is very difficult to synthesize them because they are easily formed into graphite-like substances having an $SP^2$ configuration. In addition, each of the two materials is of an indirect transition type, and no proper material for constituting a heterojunction in combination with it has been found. On the other hand, the GaAlN-based material is of a direct transition type. However, this material is limited to a mixed crystal having a considerably high Al content and easily causes crystal defects because the material is a highly ionic crystal with a weak bond, and it is very difficult to perform conductivity control of the material. In addition, the GaAlN-based material has a high possibility of causing defects upon light emission of a high energy.

As described above, there has been almost no suggestion of even a possibility of a semiconductor material required to realize a semiconductor laser capable of light emission in the ultraviolet region, i.e., having a satisfactorily wide band gap of 4 to 5 eV, capable of allowing p-n control, and being sufficiently strong so as not to be damaged by the energy of an emission wavelength.

SUMMARY OF THE INVENTION

The present invention has been made in consideration of the above situation and has as its object to provide a compound semiconductor device having a heterojunction constituted by using a novel compound semiconductor material and a method of manufacturing the same.

It is another object of the present invention to provide an ultraviolet semiconductor laser constituted by using the novel compound semiconductor material and a method of manufacturing the same.

The semiconductor device and the ultraviolet semiconductor laser according to the present invention are characterized by comprising a heterojunction constituted by a first compound semiconductor crystal elements selected from the 2nd period of the periodic table and a second compound semiconductor crystal layer consisting of a plurality of elements selected from the 2nd period of the periodic table and different from those of the first compound semiconductor crystal.

A method of manufacturing the semiconductor device and the ultraviolet semiconductor laser according to the present invention is characterized by comprising the step of forming first and second compound semiconductor layers consisting of, e.g., BN or $BeCN_2$ which originally does not easily take an $SP^3$ configuration on a substrate or a buffer layer consisting of, e.g., BP having a stable $SP^3$ configuration by a chemical vapor deposition method, thereby forming a heterojunction.

A substance such as BN consisting of elements of the 2nd period of the period table easily takes an $SP^2$ configuration to change into a graphite-like layered substance. Therefore, it has been conventionally assumed that a crystal having a desired $SP^3$ configuration can be obtained from this substance only when the temperature and pressure are extremely high. According to the studies made by the present inventors, however, it is found that epitaxial growth of c-BN having the $SP^3$ configuration, which is conventionally considered to be very difficult to perform, can be performed by properly selecting a substrate and a growth method.

Even when only a portion of a substrate has the $SP^2$ configuration, its surface is $\pi$ electron like. Therefore, when crystal growth is performed on this substrate, a $\pi$ bond which is a characteristic of the $SP^2$ configuration is inevitably formed to cause the entire grown crystal layer to have the $SP^2$ configuration. However, when a zinc blend (ZB) type crystal having a stable $SP^3$ configuration such as BP is used as a substrate, since a $\sigma$ dangling bond having a strong bonding force is present on the surface, a strong σ bond is formed with respect to B or N even under conditions in that the σ bond is originally unstable. A ZB type crystal having a stable $SP^3$ configuration grows upon repetition of this process. This phenomenon conspicuously appears when a growth method is a chemical vapor deposition method in which a surface reaction plays an important role and a used material itself is a hydride or an organic metal having the $SP^3$ configuration. This method can be similarly applied to growth of crystals containing elements (Be, B, C, and N) on the first row which easily take the $SP^2$ configuration.

Next, a material to be combined with the BN layer having the $SP^3$ configuration obtained as described above to form a heterojunction is necessary. Since BN belongs to a group of substances each having the smallest lattice constant of all the substances, substances which can make lattice matching with BN are limited to BeO and diamond similarly consisting of elements of the 2nd period. Of the two substances, BeO has very large ionicity and therefore has almost no possibility to allow conductivity control. Diamond, on the other hand, has almost the same band gap as that of BN and is of an indirect transition type. However, it is assumed that what is important in the formation of a heterojunction is a coincidence between the two-dimensional lattice shapes and lattice constants of the two materials in a junction interface and that a coincidence between the lattice constants and lattice shapes as a bulk is not necessarily required. That is, even when a material which is different in a three-dimensional lattice shape or a lattice constant from BN is used, there remains a possibility of obtaining lattice matching in a heterojunction interface with respect to BN. An example of such a crystal is a chalcopyrite crystal which is a kind of a tetragonal crystal. So far, no chalcopyrite type compound crystal consisting of elements of the 1st period has been reported. A reason for this is assumed that the crystal easily takes the $SP^2$ configuration to change into a graphite-like layered substance or the crystal changes into a cubic mixed crystal at a high temperature and a high pressure. According to a method similar to the above BN growth method, however, synthesis of a chalcopyrite type compound consisting of elements of the 2nd period having the $SP^3$ configuration is assumed to be possible even if the temperature and pressure are not extremely high. Actually, according to experiments conducted by the present inventors, a substance having a composition of $BeCN_2$ was thought to be synthesized, and it may be confirmed by X-ray diffraction and reflection spectrum measurement that the substance was a chalcopyrite type crystal having the same electron configuration as that of BN. In addition, since the band gap of this substance is slightly narrower than that of BN due to perturbation in the C axis direction, a heterojunction can be formed with respect to BN.

In order to use the $BeCN_2$ crystal layer as an active layer of a laser, the crystal layer must be of an indirect transition type. This problem can also be solved as will be described below according to the present invention. First, since $BeCN_2$ synthesized by the method of the present invention is of a chalcopyrite type, the bottom of a conduction band supposed to be present at the point X as in BN is folded to overlap the Γ point. This fact may be confirmed by reflection measurement. However, this band structure belongs to a type called a quasi-direct transition type which is originally a forbidden transition type. Therefore, since oscillation strength is small, a low oscillation threshold value cannot be obtained by simply using the $BeCN_2$ crystal layer as an active layer of a laser.

This problem, however, can be solved by adopting, e.g., a quantum well structure. To apply a quantum well to an active layer has been attempted for a GaAlAs-based infrared semiconductor laser as a method of reducing a threshold value. In particular, an effect of converting carriers into excitons upon increase of the bound energy of excitons by a maximum of four times has been expected to be promising. However, since the bound energy of excitons in an ordinary Group III-V semiconductor is at most about 5 meV, an exciting effect at room temperature is doubtful. In the semiconductor consisting of elements of the 2nd period according to the present invention, however, the effective electronic mass is much heavier than that in a Group III-V semiconductor consisting of elements of another period and reaches substantially the same value as that of a hole due to properties of an atom potential. For this reason, the bound energy of excitons, which is substantially proportional to a reduced mass of an electron and a hole, is increased about 10 times from about 6 meV of that of GaAs or the like to about 60 meV. Especially when the semiconductor is used in a well layer having the quantum well structure, since the bound energy is increased 40 times to reach 200 meV by a quantum effect, excitons are sufficiently stably present even at room temperature.

Generally, the luminous efficacy of a light-emitting device can be improved by adding a rare earth element or a transition metal element to a light-emitting layer. However, it is found from studies on a GaAs- or InP-based material that since a rare earth element or a transition metal element generally emits light by transition in the inner shell, an excitation efficiency is very low upon injection of electrons or holes because this injection is interband transition. In the substance consisting of elements of the 2nd period according to the present invention, however, it is thought that an interband transition energy is transmitted to inner-shell electrons at a high efficiency. A rare earth element is present in a lower portion of the periodic table and therefore has a small electron affinity which indicates a force of attracting electrons. However, the electron affinity of elements of the second period is much larger than those of elements of the other periods, and injected carriers form excitons bound to rare earth atoms using this difference. Since the bound excitons are localized and therefore have very large oscillation strength, the energy of the excitons is transmitted to inner-shell electrons of the rare earth atoms at a high efficiency. For this reason, light emission at a high efficiency is realized unlike in a case in which a rare earth element is added to a conventional GaAs- or InP-based material.

These effects are significant particularly in an element such as Ce in which light emission is caused by transition between f and d shells and an interaction with others is larger than that obtained when light emission is caused by transition in another f shell.

According to the present invention as described above, an ultraviolet semiconductor laser can be realized by using a new material. In addition, the material of the present invention can be applied to not only a semiconductor laser but also various heterojunction devices such as a heterojunction transistor. As a result, a device which stably operates even at high temperatures can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a compound semiconductor wafer according to an embodiment of the present invention;

FIG. 2 is a schematic view showing an MOCVD apparatus for manufacturing the wafer shown in FIG. 2;

FIG. 3 is a sectional view showing a compound semiconductor wafer of another embodiment of the present invention;

FIG. 4 is a graph showing emission wavelength characteristics of a quantum well obtained by the embodiment;

FIG. 5 is a graph showing emission intensity characteristics of the embodiment;

FIG. 8 is a sectional view showing still another embodiment in which the present invention is applied to an LED;

FIG. 9 is a sectional view showing still another embodiment of an LED in which Ce is doped in a light-emitting layer;

FIG. 10 is a sectional view showing still another embodiment of an LED in which a quantum well is applied to a light-emitting layer;

FIG. 11 is a sectional view showing still another embodiment in which the present invention is applied to a DH laser;

FIG. 14 is a sectional view showing still another embodiment of a DH laser in which a current injection portion and an oscillation portion are isolated from each other;

FIG. 15 is a view showing still another embodiment in which the present invention is applied to a heterojunction transistor;

FIG. 16 is a sectional view showing still another embodiment in which a BP buffer layer shown in FIG. 1 is replaced by a BP/BN superlattice layer; and FIG. 17 is a sectional view showing still another embodiment in which the BP buffer layer shown in FIG. 1 is replaced by a $(BN)_a(BP)_{1-a}$ mixed crystal layer.

DETAILED DESCRIPTION OF THE PREFERRED EMBODIMENTS

Figure 6:
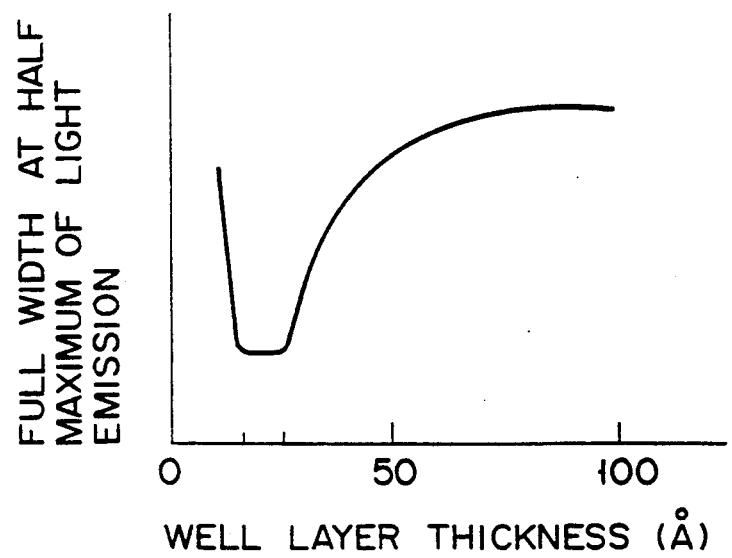
FIG. 6 is a graph showing a full width at half maximum of light emission of the embodiment.

The embodiments can be performed as follows.

FIG. 1 shows a semiconductor wafer having a $BeCN_2/BN$ heterojunction according to an embodiment of the present invention. In this embodiment, a BP layer 12 is formed as a buffer layer on a β-SiC substrate 11, a BN layer 13 is formed as a first compound semiconductor crystal layer on the BP layer 12, and a $BeCN_2$ layer 14 is formed as a second semiconductor crystal layer on the BN layer 13.

FIG. 2 shows a metal organic chemical vapor deposition (MOCVD) apparatus used to manufacture the above heterojunction semiconductor wafer. Referring to FIG. 2, reference numeral 21 denotes a quartz reactor vessel having, in its upper portion, gas supply pipes 22 ($22_1$ to $22_4$) for supplying necessary source gases. A graphite susceptor 23 is arranged in the vessel 21, and a substrate 24 is placed on the susceptor 23. An RF coil 25 for heating a substrate is wound around the outer circumferential surface of the vessel 21. Filament-like heaters 26 ($26_1$ to $26_4$) are provided at gas blowing ports of the respective source gas supply pipes 22. A gas exhaust port 27 is formed in the lower portion of the vessel 21. The reactor vessel is evacuated by a rotary pump (not shown), and the internal pressure of the vessel is maintained at a predetermined value by a slot ring valve provided at an intermediate position between the pump and the vessel.

By using the MOCVD apparatus having the above arrangement, the substrate 24 is heated by the RF coil 25, and necessary source gases are blown on the substrate 24 to perform desired crystal growth. The supplied source gases are heated to be pre-decomposed by the heaters 26 as needed.

The growth conditions and procedures will be described in detail below. The source gases used are dimethylberyllium (DMBe), triethylborane (TEB) or diborane ($B_2H_6$), trimethylgallium (TMGa), phosphine ($PH_3$), ammonia ($NH_3$), carbon tetrachloride ($CCl_4$) or methane ($CH_4$). The substrate temperature is 850° C. to 1,150° C., the pressure is 0.3 atm., and the source gas total flow rate is 1 liter/min. The gas flow rate is set to obtain a growth rate of 1 μm/h. The respective gas flow rates are, for example, $1 \times 10^{-6}$ mol/min. for DMBe and TMG, $5 \times 10^{-5}$ mol/min. for $CCl_4$, $1 \times 10^{-4}$ mol/min. for $CH_4$, $5 \times 10^{-4}$ mol/min. for $PH_3$, and $1 \times 10^{-3}$ for $NH_3$. When $CH_4$ is used as a carbon material, the filament is powered to heat the gas up to about 200° C.

When the obtained layers are checked by X-ray diffraction, reflections corresponding to a BN crystal of a ZB structure and a $BeCN_2$ crystal of a chalcopyrite structure are obtained. In addition, hole measurement is performed for the manufactured $BeCN_2$ crystal layer. As a result, it is found that the layer exhibited n-type conductivity having a carrier concentration of about $1 \times 10^{16}$ cm$^{-3}$ and that a shift from a stoichiometric ratio of Be to C is very small. That is, good crystals are grown. When the BN crystal is grown by mixing DEBe or silane gas in source gases, p-or n-type conductivity control can be performed, respectively When light absorption measurement is performed for the $BeCN_2$ crystal layer, absorption is started when an optical energy is about 5.3 eV, and the square root of the absorption coefficient is proportional to the optical energy. From this relationship, it is found that this crystal had a direct transition gap of about 5.5 eV. However, since the value of the absorption coefficient of the crystal is about $10^3$ to $10^4$ cm$^{-1}$ (about 1/10 an ordinary value), it is understood that the crystal is not of an intrinsic direct transition type. Although light emission of a wavelength of 240 nm is observed when excitation is caused upon radiation of KrF laser light having a wavelength of 225 nm, the emission intensity is comparatively weak, and the full width at half maximum is as wide as 200 meV. Since the lattice constant is a to 3.6A in a direction perpendicular to the C axis, lattice matching is almost obtained with respect to a (111) face of the BN layer. However, the lattice constant is c to 7A in the C axis direction, i.e., slightly smaller than the double of a.

By using the heterojunction wafer shown in FIG. 1 as described above, not only an ultraviolet semiconductor laser but also a device such as a heterojunction transistor can be formed.

FIG. 3 shows an embodiment in which a quantum well is formed to improve a luminous efficacy. Referring to FIG. 3, a BP buffer layer (0.5 μm) 32, a BN barrier layer (0.5 μm) 33, a BeCN$_2$ well layer (20 Å) 34, and a BN barrier layer (0.5 μm) 35 are sequentially formed on a β-SiC substrate 31. A crystal growth method is the same as that in the above embodiment. Light emission in the ultraviolet region is observed upon excitation of an ArF laser (193 nm).

FIGS. 4 and 5 show the emission wavelength and the emission intensity, respectively, as functions of the thickness of the well layer 34. Referring to FIGS. 4 and 5, when the well layer thickness is decreased to be 50 Å or less, the wavelength is decreased, and light emission of about 21.5 nm was obtained when the thickness is 10 Å. The emission intensity is abruptly increased when the well layer thickness is decreased from 50 Å, maximized when the thickness is 15 to 25 Å, and abruptly decreased when the film thickness is decreased therefrom. Although the decrease in emission wavelength and the increase in intensity are caused by a quantum effect, it is assumed that this phenomenon occurred only when the well layer thickness is much smaller than that in a conventional material due to a heavy effective electronic mass in the BN and BeCN$_2$ layers. It is assumed that the emission intensity is abruptly decreased when the thickness of the well layer 34 is decreased from 15 Å because a fluctuation in quantum well width is no longer negligible.

FIG. 6 shows the full width at half maximum of light emission as a function of the well layer thickness. Referring to FIG. 6, the spectrum becomes very sharp when the well layer thickness is 15 to 25 Å. This phenomenon is observed only at low temperatures near the liquid nitrogen temperature in a conventional material such as a GaAlAs-based material. This indicates that stable excitons are present even at room temperature in the BeCN$_2$/BN-based material.

Figure 7:
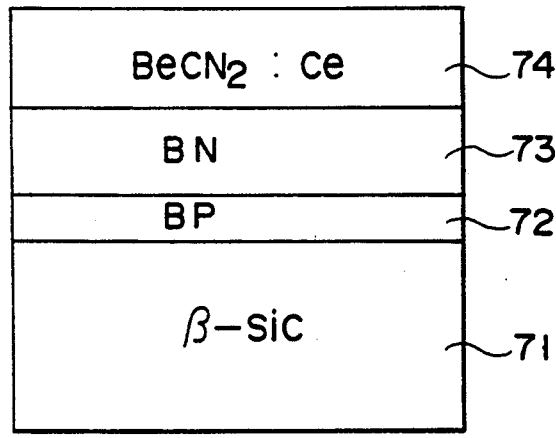
FIG. 7 is a sectional view showing a compound semiconductor wafer of still another embodiment.

FIG. 7 shows a semiconductor wafer according to still another embodiment of the present invention. In this embodiment, a 0.5-μm thick BN layer 73 and a 0.5-μm thick BeCN$_2$ layer 74 are grown on a β-SiC substrate 71 via a BP buffer layer 72. Ce as a rare earth element is doped in the BeCN$_2$ layer 74. Upon excitation of an ArF laser (193 nm), intense light emission of about 325 nm was observed. Therefore, it is understood that a device having a high luminous efficacy can be formed by using this heterojunction wafer.

In this manner, each of the above embodiments can provide a heterojunction structure which has a sufficiently wide band gap, is not damaged by ultraviolet light, and can be suitably used as an ultraviolet semiconductor laser.

Embodiments in which the present invention is applied to practical devices will be described below.

FIG. 8 shows an embodiment of an LED using a BeCN$_2$ crystal layer as a light-emitting layer. An Si-doped n-type BP buffer layer 82 is grown to have a thickness of about 2 μm on an Si-doped n-type β-SiC substrate 81, and an Si-doped n-type BN cladding layer (carrier concentration = $1 \times 10^{17}$ cm$^{-3}$) 83 is grown to have a thickness of about 3 μm on the layer 82. An undoped BeCN$_2$ layer 84 as a light-emitting layer is grown to have a thickness of about 0.5 μm on the layer 83, and a Be-doped p-type BN cladding layer (carrier concentration = $1 \times 10^{17}$ cm$^{-3}$) 85 is grown to have a thickness of about 2 μm on the layer 84. The crystal growth is performed by using the MOCVD apparatus shown in FIG. 2. In electrodes 86 and 87 are formed on the two surfaces of the device wafer.

When a 0.3-mm square chip is cut from the formed wafer and powered, a current of 70 mA flows at an application voltage of about 8 V, and light emission of a wavelength of 225 nm is observed.

FIG. 9 shows an LED of an embodiment in which a luminescence center is doped in a light-emitting layer to improve a luminous efficacy. Similar to the embodiment shown in FIG. 8, an Si-doped n-type BP buffer layer 92, an Si-doped n-type BN cladding layer (carrier concentration = $1 \times 10^{17}$ cm$^{-3}$) 93, a BeCN$_2$ layer 94 as a light-emitting layer, and a Be-doped p-type BN cladding layer (carrier concentration = $1 \times 10^{17}$ cm$^{-3}$) 95 are sequentially grown on an n-type β-SiC substrate 91, an In electrodes 96 and 97 are formed on the two surfaces of the resultant structure. Ce is doped as a luminescence center in the BeCN$_2$ layer 94 as a light-emitting layer. Triscyclopentadienylcerium Ce(C$_5$H$_5$)$_3$ is used as the Ce material.

In the LED device of this embodiment, light emission of 325 nm is obtained under the power supply conditions of 8 V and 70 mA. In this structure, Ce may be doped in the BN layer to allow the layer to serve as a light-emitting layer although the emission intensity is slightly decreased in this case.

FIG. 10 shows an LED of an embodiment using a quantum well in a light-emitting layer. An Si-doped n-type BP buffer layer 102 is formed on an n-type 1 β-SiC substrate 101, and an Si-doped n-type BN cladding layer (carrier concentration = $1 \times 10^{17}$ cm$^{-3}$) 103 is formed on the layer 102. An undoped 100-Å thick (BN)$_{0.5}$(BeCN$_2$)$_{0.5}$ mixed crystal barrier layer 104, an undoped 20-Å thick BeCN$_2$ crystal quantum well layer 105, and an undoped 100-Å thick (BN)$_{0.5}$(BeCN$_2$)$_{0.5}$ mixed barrier layer 106 are sequentially formed on the layer 103. In addition, a p-type BN cladding layer (carrier concentration = $1 \times 10^{17}$ cm$^{-3}$) 107 is grown on the layer 106, and In electrodes 108 and 109 are formed on the two surfaces of the resultant structure. This device is also formed by using the MOCVD apparatus shown in FIG. 2.

By the structure of this embodiment, considerably intense light emission of a wavelength of 220 nm is obtained under the power supply conditions of 8 V and 7 mA. Also in the structure of this embodiment, Ce can be doped in the well layer.

FIG. 11 shows an embodiment of a DH laser manufactured by using the MOCVD apparatus shown in FIG. 2 as in the above embodiments. A 0.5-μm thick n-type BP buffer layer (Si doped, $1\times10^{17}$ cm$^{-3}$) 112 is formed on an n-type SiC substrate 111, and a 1.0-$\mu$m thick n-type BN cladding layer (Si doped, $2\times10^{17}$ cm$^{-3}$) 113 is formed on the layer 112. Subsequently, a 0.1-$\mu$m thick undoped BeCN$_2$ active layer 114 and a 1-$\mu$m thick p-type BN cladding layer (Be doped, $2\times10^{17}$ cm$^{-3}$) 115 are sequentially formed. A current blocking layer 116 consisting of an SiO$_2$ film is formed on the p-type cladding layer 115 except for a central stripe-like portion having a width of 5 $\mu$m by a CVD method. In addition, an Au/Be electrode 118 is deposited as a p-side electrode on the layer 116, and an Au/Ge electrode 117 is deposited as an n-side electrode on the n-type substrate 111 on the opposite side.

The manufactured wafer is cleaved to form a laser device having a resonator length of 500 $\mu$m. When the formed device is driven at the liquid nitrogen temperature, a pulse width of 10 $\mu$sec., and a duty ratio of $10^{-3}$, an exponential increase is observed in emission power at a peak current value of 5 A or more, and laser oscillation is confirmed. The oscillation wavelength is about 220 nm.

Figure 12:
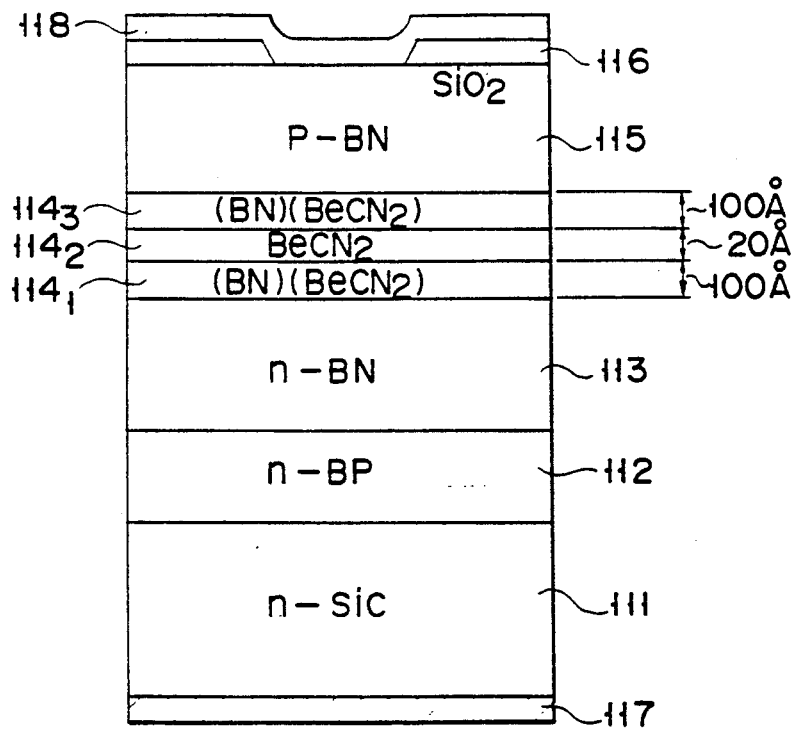
FIG. 12 is a sectional view showing still another embodiment of a DH laser in which a quantum well structure is used in an active layer.

FIG. 12 shows an embodiment in which a quantum well structure is adopted in the active layer portion shown in FIG. 11. A quantum well structure and a growth method are the same as those of the LED embodiment shown in FIG. 10. That is, in a light-emitting layer portion, a 100-Å thick undoped (BN)$_{0.5}$(BeCN$_2$)$_{0.5}$ mixed crystal barrier layer 114$_1$, a 20-Å thick undoped BeCN$_2$ crystal quantum well layer 114$_2$, and a 100-Å thick undoped (BN)$_{0.5}$(BeCN$_2$)$_{0.5}$ mixed crystal barrier layer 114$_3$ are sequentially formed.

In this embodiment, a quantum effect appeared as in the case with the LED, and laser light of 210 nm is observed when power of 2 A was supplied under the same pulse drive conditions as in the above embodiment at the liquid nitrogen temperature. In particular, the device is able to perform a laser operation even at room temperature, and laser oscillation of 220 nm is observed at a pulse peak value of 5 A.

Figure 13:
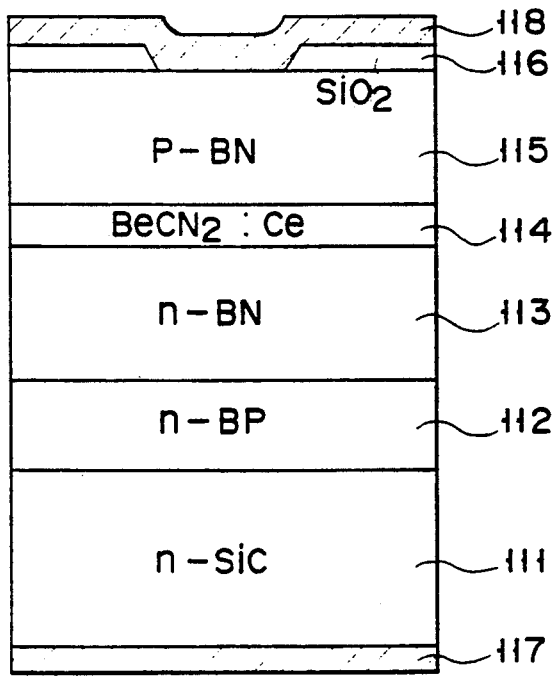
FIG. 13 is a sectional view showing still another embodiment of a DH laser in which Ce is doped in an active layer.

FIG. 13 also shows a modification of the embodiment shown in FIG. 11, in which Ce as a rare earth element is doped in the active layer 114 shown in FIG. 11. The Ce concentration is about $1\times10^{18}$ cm$^{-3}$ and the growth method is the same as in the embodiment shown in FIG. 9. In this embodiment, laser oscillation of 325 nm caused by internal transition of Ce atoms is observed at room temperature, and the peak value of an operation current at this time is about 1 A.

In the BeCN$_2$/BN-based quantum well according to the present invention, excitons are stably present even at room temperature. Since the excitons behave like quasi-particles having electrically neutral integer spins, they can move a comparatively long distance and can be caused to cohere to one another at a high density without using any special technique Therefore, a new laser structure using these properties can be formed.

FIG. 14 shows a semiconductor laser of an embodiment in which an oscillation portion and a current injection portion are isolated from each other by using the above properties. A 0.5-$\mu$m thick n-type BP buffer layer 142 (Si doped, $1\times10^{17}$ cm$^{-3}$), a 1-$\mu$m thick n-type BN cladding layer 143 (Si doped, $2\times10^{17}$ cm$^{-3}$), a 100-Å thick p-type (BN)$_{0.5}$(BeCN$_2$)$_{0.5}$ barrier layer 144 (Be doped, $1\times10^{18}$ cm$^{-3}$), a 20-Å thick undoped BeCN$_2$ quantum well layer 145, a 100-Å thick n-type (BN)$_{0.5}$(BeCN$_2$)$_{0.5}$ barrier layer 146 (Si doped, $1\times10^{18}$ cm$^{-3}$), and a 1-$\mu$m thick undoped BN cladding layer 147 are sequentially formed on an n-type SiC substrate 141. A 10-$\mu$m wide stripe-like SiO$_2$ film 149 is formed on the layer 147, and Mg is selectively diffused using the film 149 as a mask to form a p-type cladding layer 148. A p-side Au/Be electrode 151 is formed in contact with the layer 148, and an Au/Ge electrode 150 is formed on the entire n-side surface.

When a chip having a resonator length of 500 $\mu$m is cut from the above wafer and powered, laser light of 225 nm emitted from the central stripe portion is observed.

Isolation between the current injection portion and the oscillation portion in the structure of this embodiment can be explained as follows. That is, upon power supply, holes and electrons are injected from the p-type cladding layer 148 and the n-type cladding layer 143, respectively, into the well layer immediately below the Mg-doped cladding layer and are combined with each other to form excitons. Since an intense internal electric field is formed in the well layer 145 by a space charge of the impurity-doped barrier layers 144 and 146, an effective band gap of the well layer 145 is small. Since this space charge is shielded in the power-supplied portion in which the electrons and holes are injected, a narrowing effect of a band gap is reduced. As a result, the effective band gap of the well layer 145 in a portion below the central stripe-like SiO$_2$ film 19 is narrower than that in its peripheral portion. Therefore, excitons formed at the peripheral portion are rapidly accumulated in the central stripe-like portion. Since no free carriers causing light absorption are present in this stripe-like portion in which the excitons are accumulated, light amplification is performed at a very high efficiency. In this case, absorption caused by free electrons in the n-type cladding layer is generally smaller than that in the p-type layer and therefore is not taken into consideration.

Although the n-type cladding layer 143 is uniformly doped in this embodiment, n-type doping may be performed in a portion except for the stripe-like portion immediately below the light-emitting portion by means of growth under light radiation or selective doping using, e.g., an ion beam or a molecular beam. A similar method can be naturally performed for the p-type cladding layer. To change the band gaps of the light-emitting portion and the power-supplied portion, the compositions or the film thicknesses of the two portions may be changed. In addition, the position of the light-emitting portion can be largely changed by changing drive currents for a plurality of electrodes. This change width is very large reflecting a long moving distance of excitons and therefore the laser can be expected to be used in a variety of applications.

The laser of each embodiment described in detail above stably operates over 1,000 hours under a pulse operation. Each LED stably emitted light over 2,000 hours, and its luminance reduction is 20% or less. When an emission pattern of the light-emitting portion is observed after power is supplied for a long time period, a large number of black dots are found in positions corresponding to positions of through dislocations in a grown epitaxial layer. Therefore, in the material according to the present invention, unlike in a conventional GaAlAs-based material and the like, it is assumed that neither movement nor multiplication of dislocations occurs during an operation due to a strong $\sigma$ bond between elements of the 2nd period.

FIG. 15 shows an embodiment in which the present invention is applied to a heterojunction transistor. An n-type BN collector layer 153, a p-type BeCN$_2$ base layer 154, and an n-type BN emitter layer 155 are sequentially formed on an n-type SiC substrate 151 via an n-type BP buffer layer 152. Growth of these crystal layers is performed using the MOCVD apparatus shown in FIG. 2 as in each of the above embodiments. An emitter electrode 156 is formed on the BN emitter layer 155, a base electrode 157 is formed on the BeCN$_2$ base layer exposed by etching, and a collector electrode 158 is formed on the lower surface of the substrate.

The heterojunction transistor of this embodiment can stably operate even at high temperatures because materials having large band gaps were used.

The present invention is not limited to the above embodiments. For example, as the buffer layer, a BN/BP superlattice layer 15 in which an average composition is changed in the direction of thickness as shown in FIG. 16 or a $(BN)_a(BP)_{1-a}$ mixed crystal layer 16 shown in FIG. 17 may be used in place of the BP layer. Although these layers are used in place of the buffer layer of the embodiment shown in FIG. 1, they can be similarly applied to the other embodiments. In addition, although only the BN/BeCN$_2$ heterojunction is used in each of the above embodiments, a heterojunction constituted by another combination of elements of the 2nd period of the periodic table, e.g., a diamond-/LiBO$_2$ heterojunction can be similarly used. As the substrate, GaP or the like can be used in place of SiC. When GaP is used as a substrate and the substrate is removed after necessary crystals are grown, a longer life can be expected because a strain caused by lattice mismatching is removed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An ultraviolet semiconductor laser having a heterojunction, wherein said heterojunction is constituted by a first compound semiconductor crystal layer consisting of a combination of a plurality of elements selected from the 2nd period of the periodic table and a second compound semiconductor crystal layer consisting of a combination of a plurality of elements selected from the 2nd period of the periodic table and different from the elements of said first compound semiconductor crystal layer.

2. A laser according to claim 1, wherein said first compound semiconductor crystal layer consists of BN, and said second compound semiconductor crystal layer consists of BeCN$_2$.

3. A laser according to claim 1, wherein said first compound semiconductor crystal layer consists of BN having a zinc blend type crystal structure, and said second compound semiconductor crystal layer consists of BeCN$_2$ having a chalcopyrite type crystal structure.

4. A laser according to claim 1, wherein said first compound semiconductor crystal layer and said second compound semiconductor crystal layer are formed on a substrate or a buffer layer having an SP$^3$ configuration.

5. A laser according to claim 1, wherein said first compound semiconductor crystal layer and said second compound semiconductor crystal layer are formed on a BP layer formed on a substrate.

6. A laser according to claim 1, wherein said first compound semiconductor crystal layer and said second compound semiconductor crystal layer are formed on a BN/BP superlattice layer which is formed on a substrate and in which an average composition is changed in a direction of thickness.

7. A laser according to claim 1, wherein said first compound semiconductor crystal layer and said second compound semiconductor crystal layer are formed on a $(BN)_a(BP)_{1-a}$ mixed crystal layer formed on a substrate.

8. An ultraviolet semiconductor laser comprising:
a substrate;
a first compound semiconductor crystal layer formed on said substrate via a buffer layer and consisting of a combination of a plurality of elements selected from the 2nd period of the periodic table;
a second compound semiconductor crystal layer formed on said first compound semiconductor crystal layer, consisting of a combination of a plurality of elements selected from the 2nd period of the periodic table and different from the elements of said first compound semiconductor crystal layer, and serving as a quantum well layer; and
a third compound semiconductor crystal layer formed on said second compound semiconductor crystal layer and having the same composition as that of said first compound semiconductor crystal layer.

9. A laser according to claim 8, wherein said substrate is a semiconductor crystal substrate having an SP$^3$ configuration.

10. A laser according to claim 8, wherein said buffer layer is a BP layer.

11. A laser according to claim 8, wherein said buffer layer is a BN/BP superlattice layer in which an average composition is changed.

12. A laser according to claim 8, wherein said buffer layer is a $(BN)_a(BP)_{1-a}$ mixed crystal layer.

13. A laser according to claim 8, wherein said first compound semiconductor layer and said third compound semiconductor crystal layer consist of sphalerite type BN, and said second compound semiconductor crystal layer consists of chalcopyrite type BeCN$_2$.

14. A laser according to claim 8, wherein a current injection portion and an oscillation portion are formed to be spatially isolated from each other.

15. A semiconductor device having a heterojunction, wherein said heterojunction is constituted by a first compound semiconductor crystal layer consisting of a combination of a plurality of elements selected from the 2nd period of the periodic table and a second compound semiconductor crystal layer consisting of a combination of a plurality of elements selected from the 2nd period of the periodic table and different from the elements of said first compound semiconductor crystal layer.

16. A method of manufacturing a compound semiconductor device having a heterojunction constituted by first and second compound semiconductor crystal layers, comprising the steps of:
forming, by a chemical vapor deposition method, a first compound semiconductor crystal layer consisting of a combination of a plurality of elements selected from the 2nd period of the periodic table and having an SP$^3$ configuration on a substrate having the SP$^3$ configuration or a buffer layer formed on a substrate and having the $SP^3$ configuration; and forming, by the chemical vapor deposition method, a second compound semiconductor crystal layer consisting of a combination of a plurality of elements selected from the 2nd period of the periodic table and different from the elements of said first compound semiconductor crystal layer, and having the $SP^3$ configuration on said first compound semiconductor crystal layer.

* * * * *